(12) United States Patent
Mirzaei et al.

(10) Patent No.: US 8,538,347 B1
(45) Date of Patent: Sep. 17, 2013

(54) LOW POWER MULTI-BAND, MULTI-MODE TRANSMITTER

(75) Inventors: Ahmad Mirzaei, San Diego, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/448,971

(22) Filed: Apr. 17, 2012

(51) Int. Cl.
*H04B 1/02* (2006.01)

(52) U.S. Cl.
USPC .................. 455/91; 455/127.4; 455/127.2

(58) Field of Classification Search
USPC ............... 455/91, 127.4, 127.2; 375/295, 375/307
See application file for complete search history.

(56) References Cited

U.S. PATENT DOCUMENTS

| | | | |
|---|---|---|---|
| 8,073,387 B2* | 12/2011 | Maslennikov et al. | 455/24 |
| 8,364,074 B2* | 1/2013 | Park et al. | 455/7 |
| 2005/0253711 A1* | 11/2005 | Nelson | 340/552 |
| 2010/0210205 A1* | 8/2010 | Park et al. | 455/7 |

* cited by examiner

*Primary Examiner* — Creighton Smith
(74) *Attorney, Agent, or Firm* — Brinks Hofer Gilson & Lione (57) ABSTRACT

A transmitter includes a power amplifier driver connected with a first transformer and a second transformer. The first transformer is configured for a high-band mode and the second transformer is configured for a low-band mode. The power amplifier driver drives both the first transformer and the second transformer.

20 Claims, 10 Drawing Sheets

LOW POWER MULTI-BAND, MULTI-MODE TRANSMITTER

1. TECHNICAL FIELD

This disclosure relates generally to communication systems and methods. More particularly, it relates to low-power, low-area and/or multi-band, multi-mode transmitters.

2. BACKGROUND

A transmitter or radio transmitter in electronics and telecommunications is an electronic device which with an antenna produces radio waves. The transmitter can generate a radio frequency alternating current, which can be applied to the antenna. When excited by the alternating current the antenna can radiate radio waves. The transmitter can be used in equipment that generates radio waves for communication purposes and radiolocation, such as radar and navigational transmitters. Generators of radio waves for heating or industrial purposes can also include transmitters.

BRIEF DESCRIPTION OF THE DRAWINGS

The system may be better understood with reference to the following drawings and description. In the figures, like reference numerals designate corresponding parts throughout the different views.

DETAILED DESCRIPTION

The description below relates to a transmitter that can reduce power consumption and a die area versus some typical transmitters. A 2.7 Volt supply to the power amplifier driver, which can be a main current consuming block of a cellular transmitter, can be replaced with a lower voltage supply, such as about 1.5 Volts, or less. About twenty-five percent in power consumption may be saved without substantially impacting a performance of the transmitter. Also, driver blocks including passive mixers can be shared among communication bands, which can improve the die area. Additionally, an active baseband low-pass filter can be replaced with a passive one, resulting in less power consumption, lower area and better noise performance. This transmitter architecture can be used for multi-band, multi-mode applications.

Figure 1:
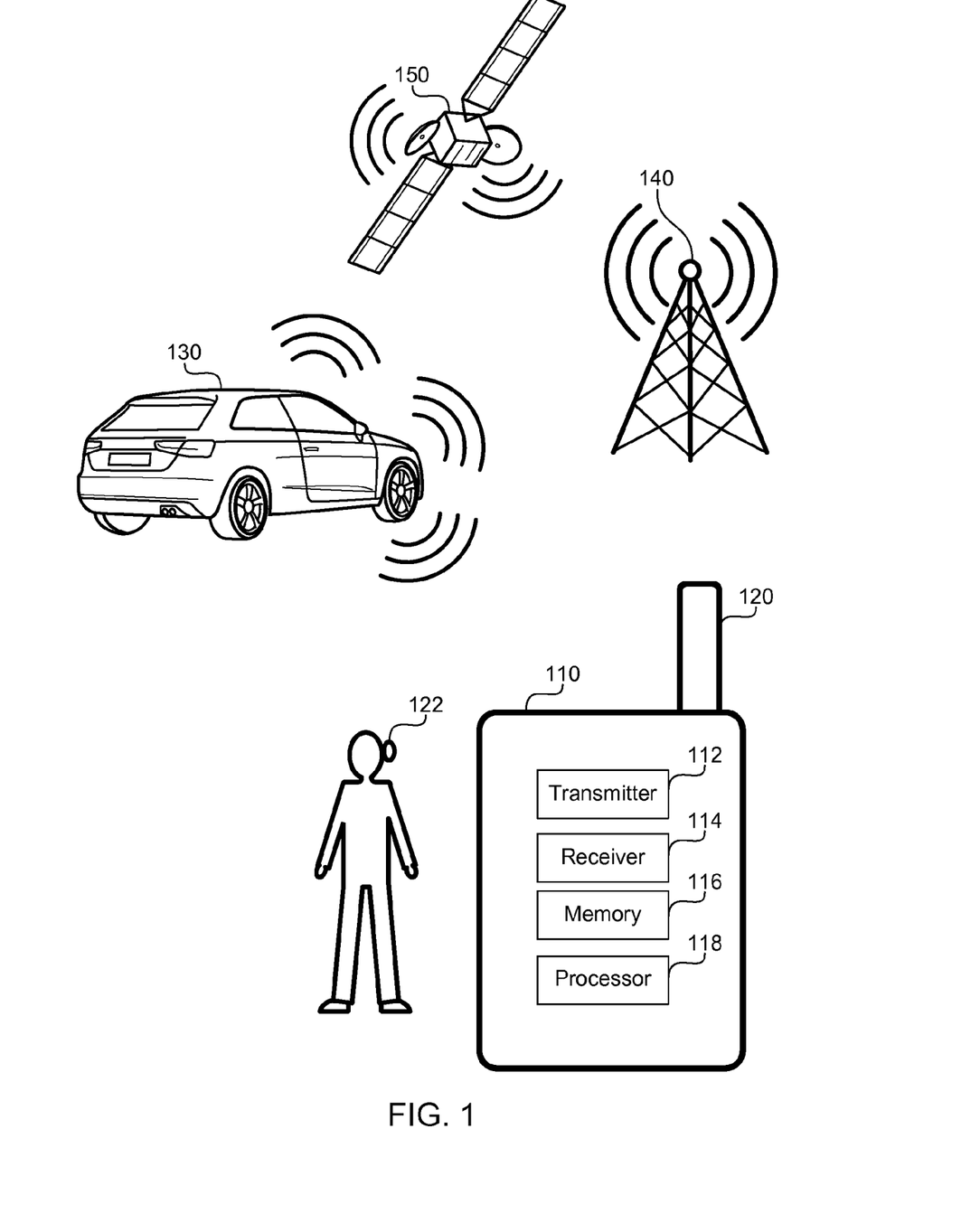
FIG. 1 is a block diagram of an exemplary communication environment.

FIG. 1 is a block diagram of an exemplary communication environment 100. Communication signals can be sent between endpoints. In one example, the endpoint is a communication device 110, such as a cell phone, personal digital assistant, tablet, portable email device, smartphone or a portable gaming system. The communication device can include a transmitter 112, a receiver 114, a memory 116, a processor 118 and an antenna 120 to wirelessly exchange information, e.g., emails, text messages, radio, music, television, videos, video games, digital information, etc., with other endpoints. The transmitter 112 and receiver 114 can be configured separately or together, such as in a transceiver. The communication device 110 may also wirelessly connect to a radio receiver or other audio device such as earpiece 122.

The communication environment 100 can also include other endpoints such as vehicles 130, such as automobiles, aircraft, ships and spacecraft. The communication environment 100 can also devices to provide a communication link between the endpoints such as cellular towers 140 and satellites 150. Transmitters 112 can also be component parts of many electronic devices that communicate by radio, such as wireless computer networks, Bluetooth enabled devices, garage door openers, radar sets, and navigational beacons. The antenna 120 may be enclosed inside a case or attached to the outside of the transmitter 112, as in portable devices such as cell phones, walkie-talkies, and auto keyless remotes.

Figure 2:
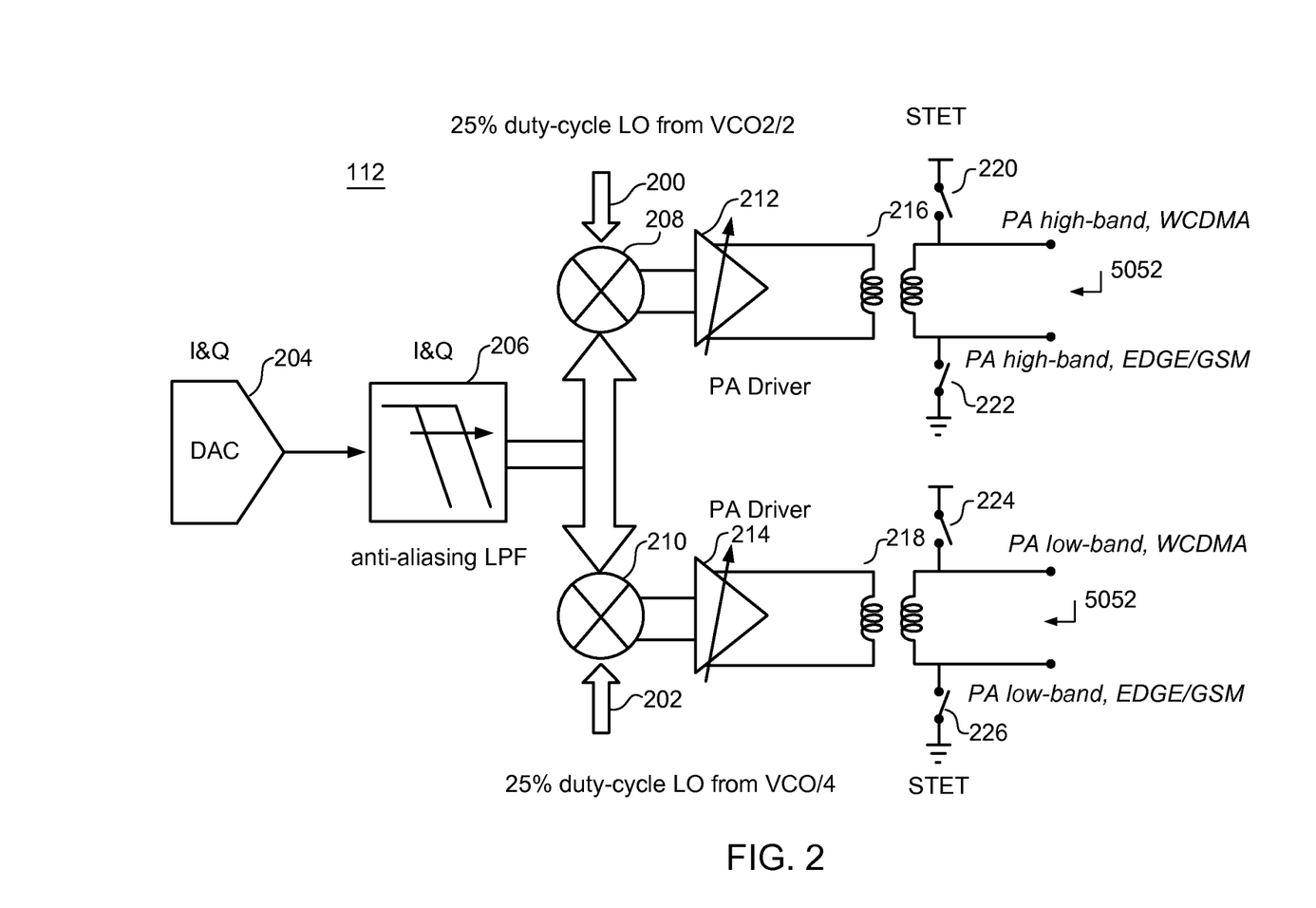
FIG. 2 is a circuit diagram of an exemplary transmitter.

FIG. 2 is a circuit diagram of an exemplary transmitter 112. The transmitter 112 can provide both wide band code division multiple access (WCDMA) and enhanced data rate for global evolution/global system for mobile (EDGE/GMS) communication channels, in the high band, e.g., 2 Ghz, and the low band, e.g., 1 Ghz. WCDMA and EDGE can receive IQ channels and GSM can receive direct modulation from a phase-locked loop (PLL). Both the high and low bands can include dedicated radio frequency (RF) front-ends. Illustrated electronic components of the transmitter 112 may be replaced by similar components having similar functions according to a specific application requirement or other considerations.

The transmitter 112 can be connected to local oscillators (LO) 200, 202 that provide a frequency for signal modulation. The transmitter 112 can include a digital-to-analog converter (DAC) 204, such as one DAC for the I channel and one DAC for the Q channel. The DAC 204 converts digital codes to analog signals. The analog signals are then sent to a low pass filter (LPF) 206, for example a third order Chebyshev filter. There can be one low pass filter for the I channel and one LPF for the Q channel. The LPF outputs a filtered analog signal to the frequency mixers 208 and 210. The mixer 208 creates new frequencies from two signals: a 25% voltage-controlled oscillator frequency and the filter analog signal from the LPF 206. The mixer 210 creates new frequencies from two signals: a 25% voltage-controlled oscillator frequency and the filter analog signal from the LPF 206.

The mixers 208 and 210 can output up-converted, modulated analog signals to power amplifier (PA) drivers 212 and 214, respectively. The PA drivers 212, 214 output amplified signals to transformers 216, 218, e.g., balun transformer, respectively. Switches 220 and 222 connect the outputs of the PA driver 212 and transformer 216 with ground to control whether the transmitter 112 is outputting in the high band WCDMA or the high band EDGE/GMS mode. Switches 224 and 226 connect the outputs of PA driver 212 and transformer 218 to ground to control whether the transmitter 112 is outputting in the low band WCDMA or the low band EDGE/GMS mode. In this design the PA drivers 212 and 214 are linear and can provide a power output about as high as 6 dBm. To accommodate WCDMA there can be about an 800 millivolt swing up and down at the outputs of the PA driver 212 and 214 which can require about a 2.7 V supply.

Figure 3:
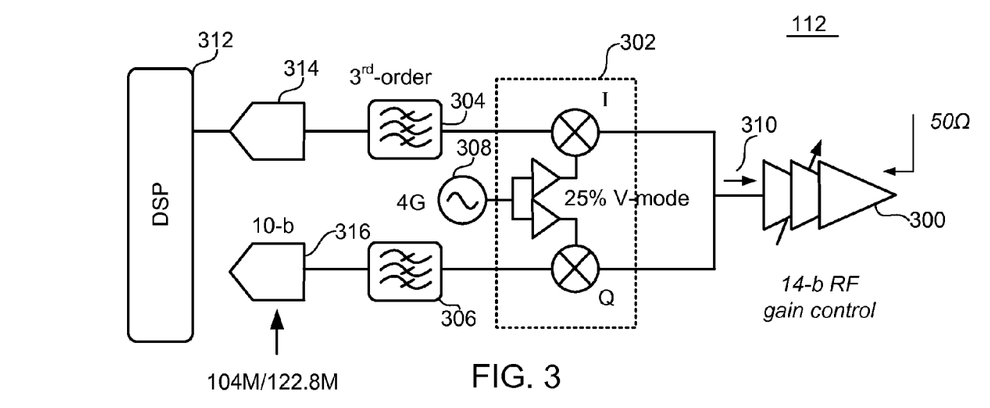
FIG. 3 is a circuit diagram of another example of the transmitter.

FIG. 3 is a circuit diagram of another example of the transmitter 112. The transmitter 112 can operate at about 1.5 V, or less, and match about a 50 ohm impedance with no external components. As discussed in more detail in FIGS. 4 through 11 the gain control can be accomplished with a single PA driver 300 for the low and high bands of the WCDMA and EDGE/GSM modes. The PA driver may provide for about 14-bit gain control. The PA driver 300 also connects with a single IQ mixer 302. The IQ channels can be converted for WCDMA and EDGE, and direct PLL modulation can be used for GSM. The IQ mixer 302 receives filtered analog signals from low pass filters 304 and 306, and LO from voltage-controlled oscillator 308 and outputs the modulated analog signal 310. The analog signals can begin as digital signals from a digital signal processor 312, including audio, video and/or data signals, and are converted to analog signals with DACs 314 and 316. An exemplary DAC includes 10 bit resolution and 104M/112.8M clock frequency.

Figure 4:
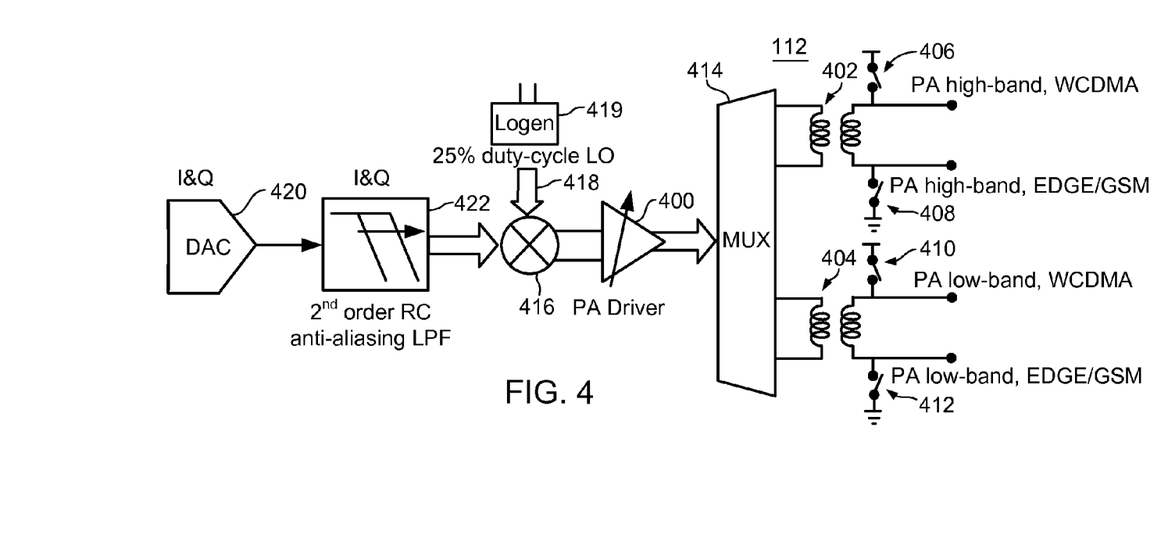
FIG. 4 is a circuit diagram of another example of the transmitter.

FIG. 4 is a circuit diagram of another example of the transmitter 112. A single PA driver 400 can drive two transformers 402 and 404 for the high and low bands. The transformer 402 can be optimized for high-band transmissions and the transformer 404 can be optimized for low-band transmissions. Switches 406, 408, 410 and 412 connect the transformers 402 and 404 to ground to control whether the transmitter 112 is transmitting in high-band or low-band WCDMA or high-band or low-band EDGE/GMS mode. Whichever switch 406, 408, 410 or 412 is open that is the mode that is being transmitted. The outputs from the transformers 402 and 404 can be single ended and the transmitter 112 can provide for 50 ohm impedance.

Imbedded into the PA driver 400 is a multiplexer (MUX) 414. In other implementations the MUX can be separate from the PA driver 400. The MUX 414 may be integrated into the PA driver 400 such as by incorporating a steering circuit, e.g., the steering circuit 640 described in FIGS. 6-9. Connected to the PA driver 400 is a single mixer 416 that handles both the I and Q channels for high-band and low-band and WCDMA and EDGE modes. An exemplary mixer is described in FIG. 5. The mixer 416 can allow for smaller loading of the local oscillator generation than if more than one mixer were used, such as in FIG. 2. The mixer 416 mixes the local oscillator signal 418 with the filtered analog signal received from the DAC 420 and LPF 422. The local oscillator signal 418 can be generated by local oscillator generator (LOGEN) 419, for example the LOGEN described in FIG. 10 or another LOGEN.

For Gaussian minimum shift keying (GMSK), e.g., GSM mode, the mixer 416 can be off and a modulated voltage controlled output directly drives the PA driver 400 inputs. The DAC and the LPF can also be shut off since the GSM mode can be directly derived from the voltage controlled output, e.g., from the PLL. The mixed signal can be calibrated at the PA driver 400 which can allow for single point calibration for both LO feed-through and the image rejection ratio of the IQ channels, e.g., across all bands and channels. The transmitter 112 can provide for less power consumption than if the number of mixers and PA drivers equaled the number of transformers.

Figure 5:
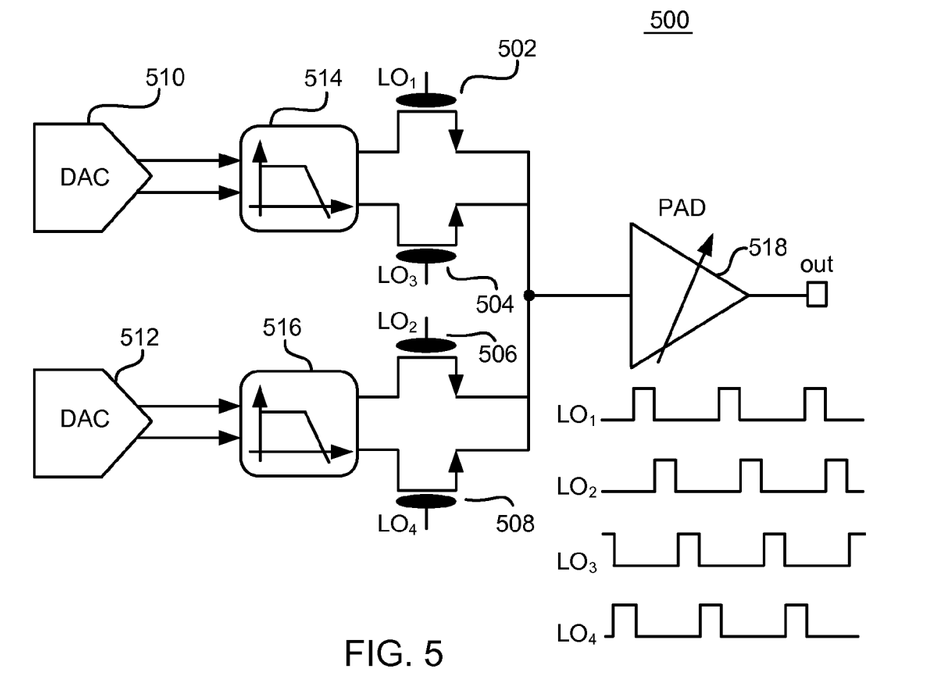
FIG. 5 is a circuit diagram of an exemplary mixer that can be used to mix signals for the transmitters described herein.

FIG. 5 is a circuit diagram of an exemplary mixer 500 that can be used to mix signals for the transmitters 112 described herein. The mixer 500 can be a passive mixer including switches 502, 504, 506 and 508 driven by LOs. The LOs can be 25% clock signals delayed by quarter clock periods. Other LO sizes and frequencies can also be used with the transmitter 112. DACs 510 and 512 and LPFs 514 and 516 provide an analog filtered signal to the switches 502, 504, 506 and 508. A PA driver 518 connects with the outputs of the switches 502, 504, 506 and 508 to amplify the mixed analog signal.

Figure 6:
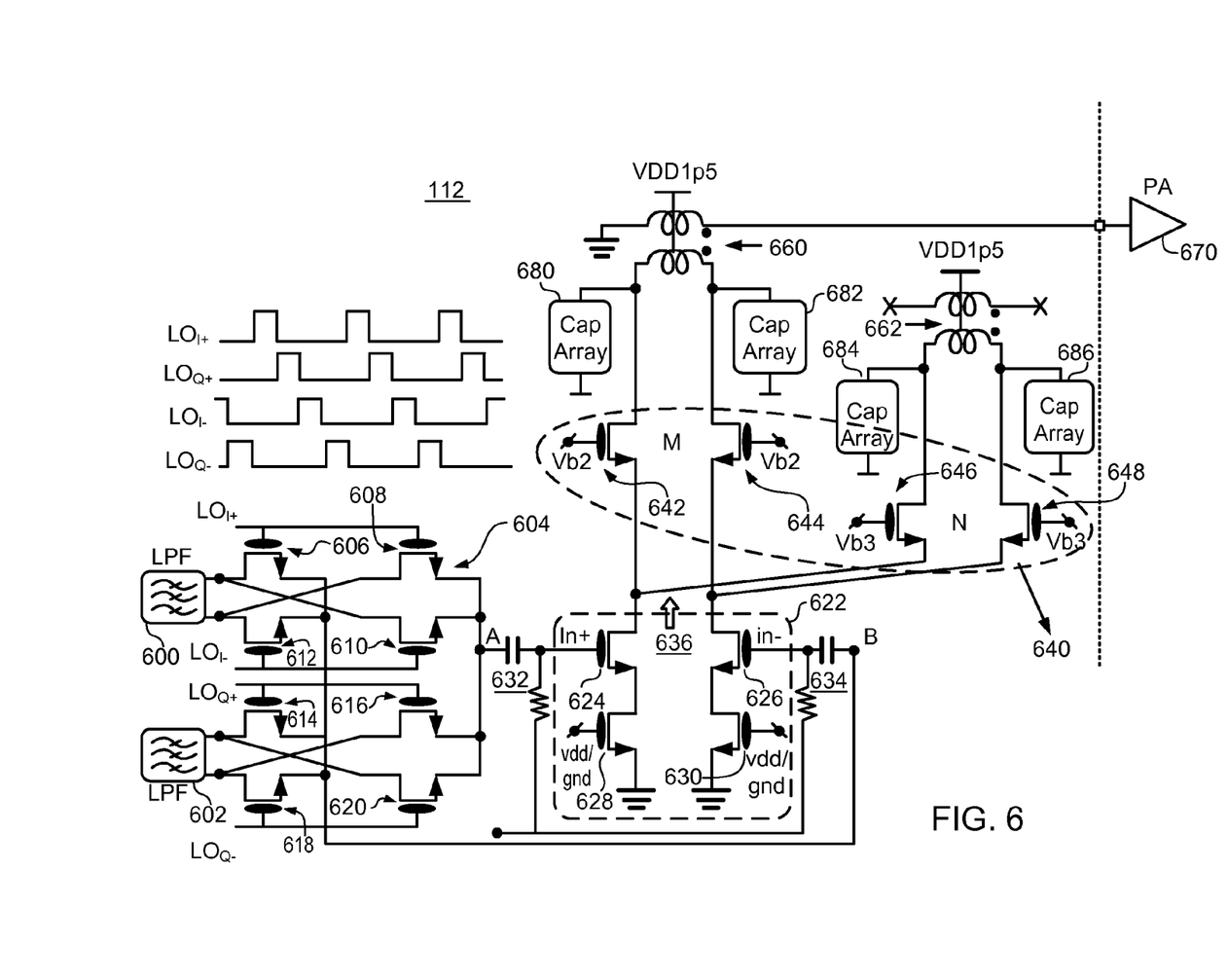
FIG. 6 is a circuit diagram of an exemplary transmitter in WCDMA/EDGE mode.

FIG. 6 is a circuit diagram of an exemplary transmitter 112 in a WCDMA/EDGE mode. To filter and up-convert the analog signal, the transmitter 112 can include LPFs 600 and 602 connected with mixer 604. The mixer 604 can include switches 606, 608, 610, 612, 614, 616, 618 and 620. The switches can include low voltage, 40 nanometer n-channel MOSFET (NMOS) transistors. In other implementations PMOS or other types of switching devices can be used. Switches 606 and 608 can be driven by the local oscillator LO I+ channel, switches 610 and 612 can be driven by the LO I− channel, switches 614 and 616 can be driven by the LO Q+ channel, and switches 618 and 620 can be driven by the LO Q− channel. The mixer 604 sends an up-converted radio frequency (RF) signal at point A and point B is the signal differential.

To provide gain to the RF signal, the RF signal is input to a gain unit 622, such as a Gm unit, which includes metal oxide semiconductor (MOS) devices 624, 626, 628 and 630, or other switches. To control an amount of gain, if a voltage vdd is applied to switches 628 and 630 the gain unit 622 is on, otherwise the gain unit 622 is off. Therefore voltage Vb1 is added to bias the cascode MOS devices 624, 626, 628 and 630. The gain unit 622 can be implemented with an array of multiple gain units arranged on a chip, e.g. sixty-three gain units. The individual gain units in such an array can contribute to the gain or not, depending on whether they are turned on or not, allowing for six bits of gain controllability or about zero to 32 dB of gain control. For purposes of simplicity of explanation, only one gain unit 622 is illustrated. Capacitor/resistor elements 632 and 634 can be connected in parallel to the inputs of the gain unit 622. The capacitor can be an alternating current (AC) couple capacitor passing the up-converted TX signals at the RF frequency from node A or B to the gates of the Gm units. The resistor can provide the bias voltage Vb1 to the gates of the Gm unit. About a 4 pico farad and about a 100 k ohm resister can be used.

After applying gain and to provide high-band and low-band multiplexer duties, an amplified signal 636 can outputted by the gain unit 622 to steering circuit 640. The steering circuit 640 can include a high-band steering circuit M and a low-band steering circuit N. Other amounts of steering circuits can be used. The M circuit can include switches 642 and 644 and the N circuit can include switches 646 and 648 for controlling band selection. If the M circuit is activated, for example by applying a high bias voltage Vb2, e.g., about 1.2 V, to switches 642 and 644 and the N circuit is deactivated, for example by applying a low voltage Vb3, e.g. about 400 millivolt to switches 646 and 648, then the transmitter 112 is operating in the high-band. If the N circuit is activated, for example by applying a high voltage Vb3 to switches 646 and 648 and the M circuit is deactivated, for example by applying a low voltage Vb2 to switches 642 and 644, then the transmitter 112 is operating in the low-band.

The transmitter 112 can also include high-band transformer 660 and low-band transformer 662 connected with the steering circuit 640. In this example, the transmitter is operating in the high-band so the high-band transformer 660 is shown connected to power amplifier (PA) 670. In other examples the low-band transformer 662 is connected to a corresponding PA (not shown in FIG. 6). The transmitter 112 can also include capacitor arrays 680, 682, 684 and 686. The capacitor arrays 680, 682, 684 and 686 can provide additional power to the amplified signal 636 by ensuring that the signal is operating in the resonance frequency for maximum gain. The capacitor array 680, 682, 684 and 686 can be implemented with switched capacitors having variable capacitance.

In addition, the turn ratio of the primary windings of the transformer 660 and 662 can be lowered from the typical turn ratio to lower the internal voltage swings, e.g., to about less than 500 millivolts, which allows for a lower supply voltage, such as 1.5 V instead of 2.7 V. Therefore, the voltage VDD applied to the transformers 660 and 662 to power the transmitter 112 can be reduced from 2.7 V to 1.5 V.

Figure 7:
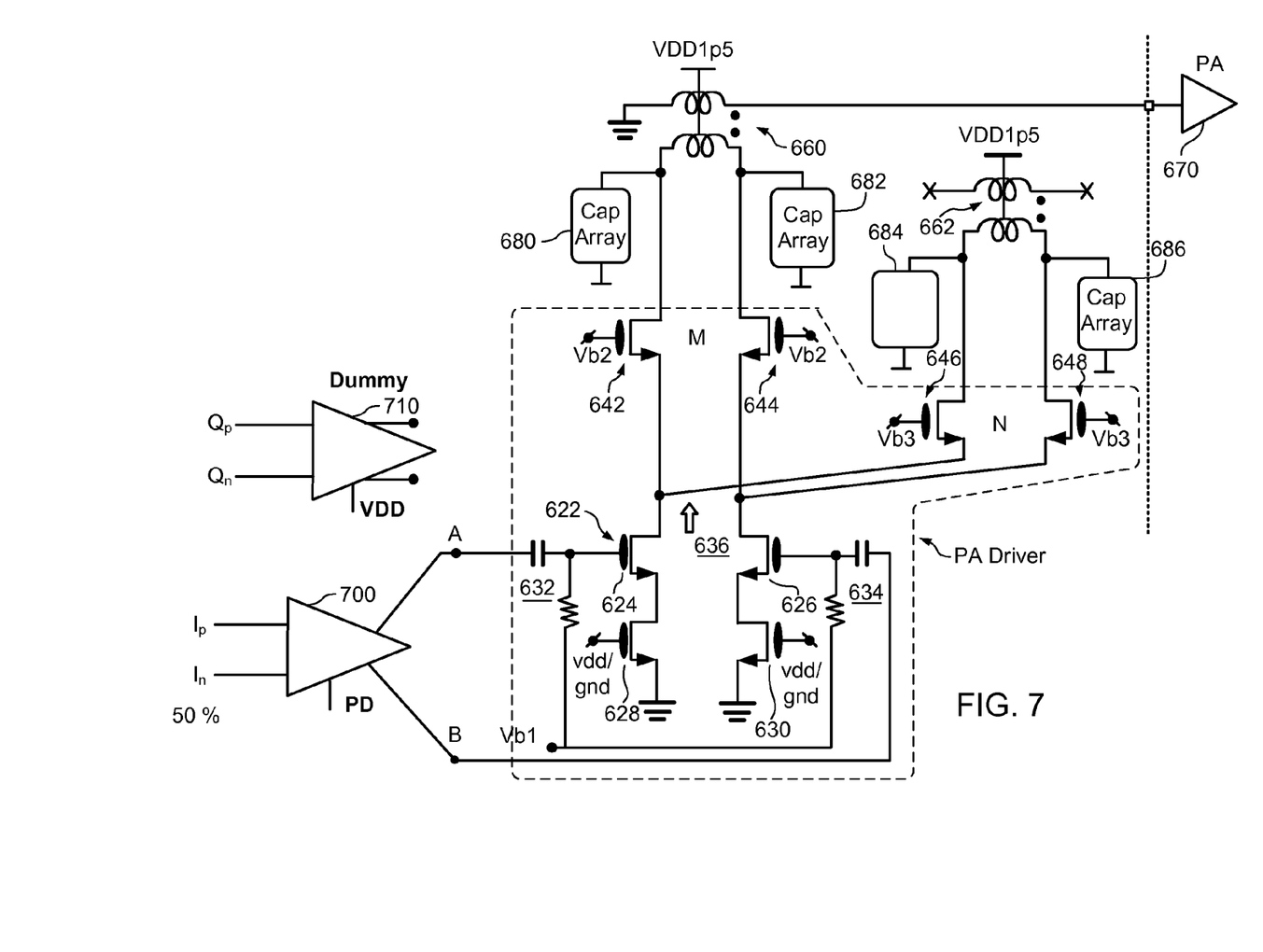
FIG. 7 is a circuit diagram of an exemplary transmitter in GMSK mode.

FIG. 7 is a circuit diagram of an exemplary transmitter 112 in GMSK (e.g. GSM) high-band mode. The LPFs and mixers (not shown here, see e.g., FIG. 6) are powered down for GMSK. In GMSK phase modulated mode a PLL divided output followed by buffer 700 directly drives the PA driver. The 25% duty-cycle oscillator block can be turned off and the original 50% clock can drive the PA driver. The buffer 700 receives Ip, In and power down (PD) inputs. The gain can be controlled by gain unit 622. A dummy buffer 710 can be included to provide load balancing between the I clock and the Q clock. To operate in the low-band mode, N can be activated and M deactivated by applying a high voltage to Vb3 and a low voltage to Vb2.

Figure 8:
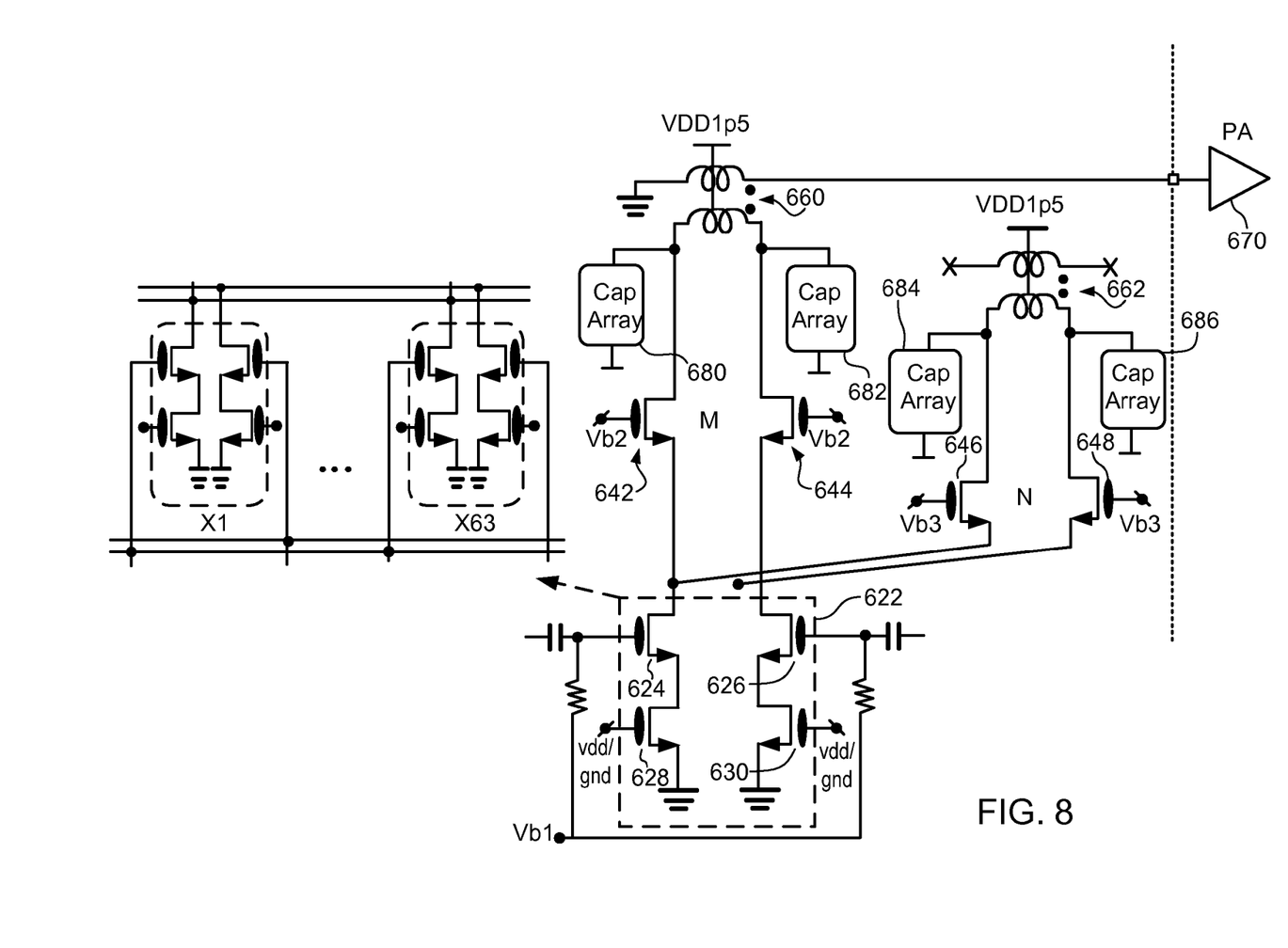
FIG. 8 is a circuit diagram of an exemplary gain control circuit.

FIG. 8 is a circuit diagram of an exemplary gain control circuit 622, such as for a PA driver. In an embodiment there are 6 bits of gain control in the gain unit 622, e.g., Gm unit, or sixty-three unity cells X1 to X63. Different amounts of gain can be achieved by turning on or off from zero to 63 units. Other amounts of units can be used. For example, for 7 bit gain control 127 units may be used.

Figure 9:
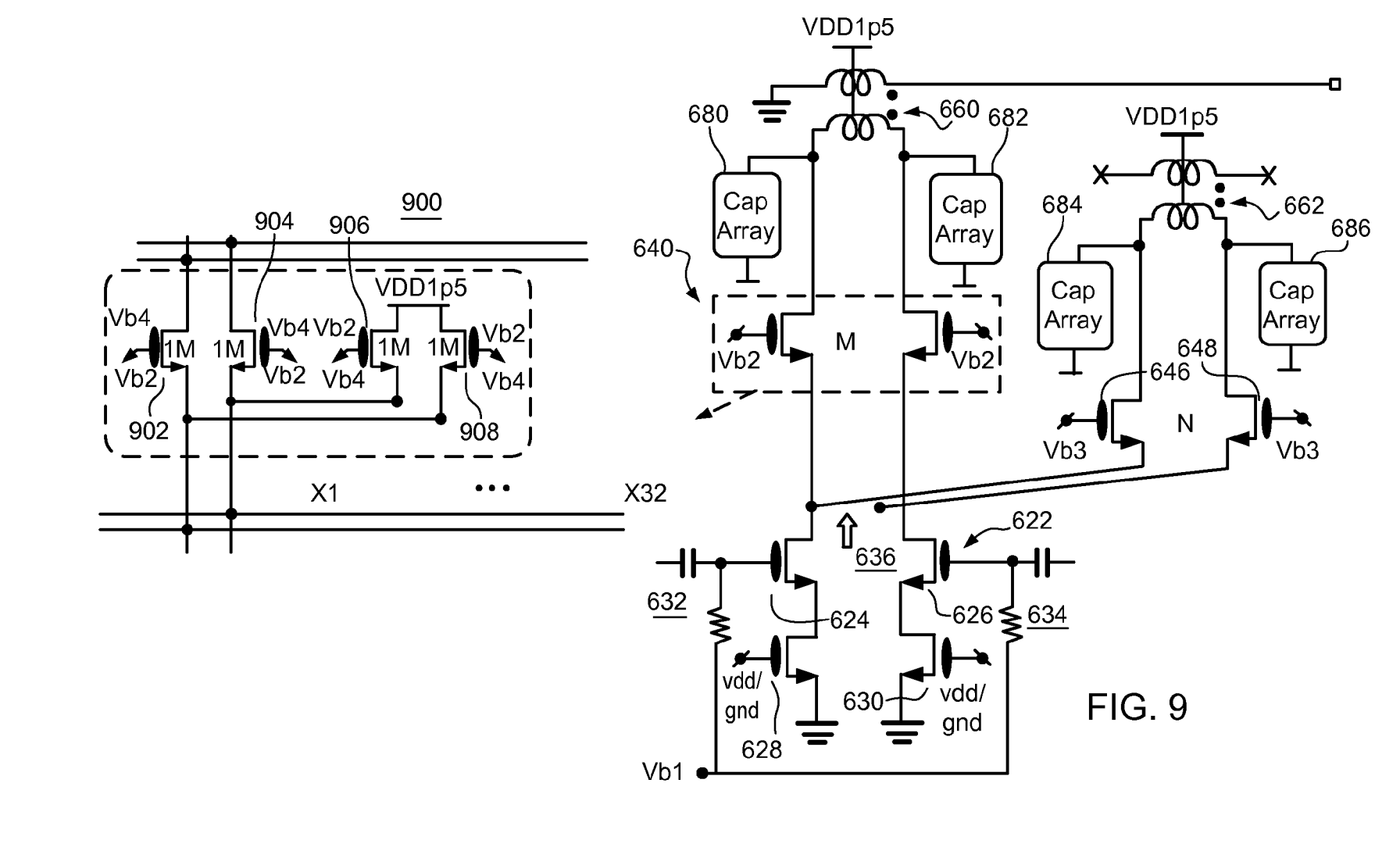
FIG. 9 is a circuit diagram of another exemplary gain control circuit.

FIG. 9 is a circuit diagram of another exemplary gain control circuit 622, such as for a PA driver. Alternatively or in addition to the gain unit 622, the steering circuit 640 can be used to provide gain control. In this example, up to about 6 bits of gain control are provided by the steering circuit 640. Other amounts of gain control can also be provided by increase or decreasing elements in the array of M and N devices.

For example, the M part 900 of the steering circuit 640 can include an determined array of M devices. The M part may include sets of switches 902, 904, 906 and 908. The switches can be constructed of different widths to provide for various voltage drops across them. For purposes of explanation, a first unit X1 of switches 902, 904, 906 and 908 may include a device width of one micron. Moreover, a second unit X2 of four similar switches may include a two micron width, a third unit X4 may be four micron in width switches, a fourth unit X8 may be eight microns in width, a fifth unit X16 may be 16 microns and a sixth unit X32 may include switches that are 32 microns in width. Other numbers of units and widths for the switches can be used. The same or similar setup can be implemented for the N devices to provide additional gain in the low-band.

For purposes of simplicity of explanation two units are described: a first unit with switches of one micron in width and a second unit with switches of two microns in width. Due to impedance caused by the different widths, two-thirds of the current passes through the second unit and one-third of the current passes through the first unit. The units in which a high voltage, e.g., about 1.2 V, is supplied to Vb4 contribute to the gain and the units in which a low voltage, e.g., 400 millivolts, is supplied to Vb4 do not contribute to the gain. Therefore, if high voltage is supplied to the first units and low voltage is supplied to the second units, one-third of the gain is added to the amplified signal 636. If low voltage is supplied to the first units and high voltage is supplied to the send units, two-thirds of the gain is added to the amplified signal 636.

Figure 10:
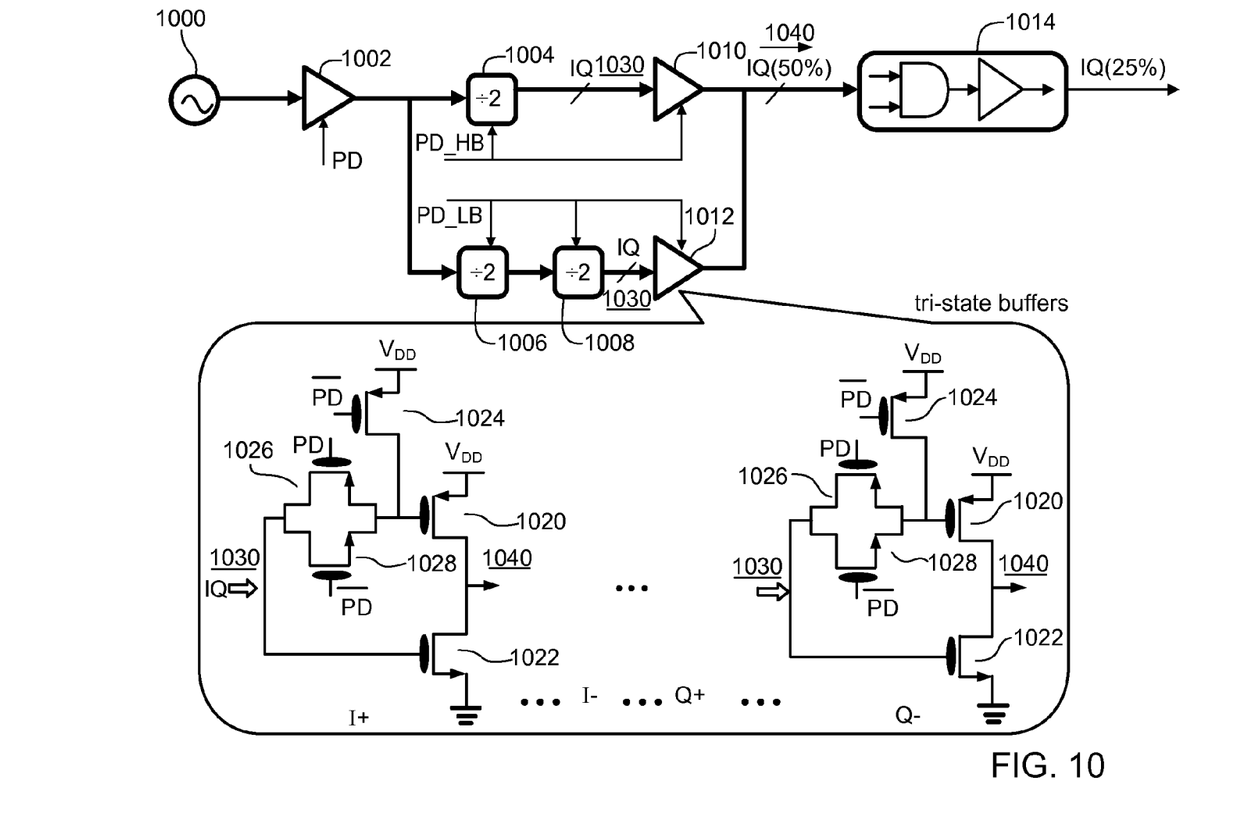
FIG. 10 is a circuit diagram of an exemplary local oscillator generator.

FIG. 10 is a circuit diagram of an exemplary local oscillator generator, e.g., that can be used to generate the LO signals for the transmitter 112. A PLL loop can set frequency of the voltage-controlled oscillator output 1000. A buffer 1002 receives the oscillator output 1000 to ensure buffering of the PLL. In high-band mode, e.g., 2 Gb/s transmission rate, divider 1004 is on and dividers 1006 and 1008 are off. The dividers can include divide-by-two dividers or other divider values depending on an implementation. In low band-mode, e.g., 1 Gb/s transmission rate, dividers 1006 and 1008 are on and divider 1004 is off.

The circuit can also include a buffer 1010 connected with the output of divider 1004 and buffer 1012 connected with the output of dividers 1006 and 1008. In the high-band mode buffer 1010 is on and buffer 1012 is off, and in the low-band mode buffer 1010 is off and buffer 1012 is on. The dividers 1004, 1006 and 1008 and the buffers 1010 and 1012 can be turned on and off with power down signals PD_HB and PD LB to control operation in the high-band or low-band modes. The output 1040 of the buffers 1010 and 1012 is a fifty percent clock IQ (50%) signal. The buffer output 1040 is sent to an AND gate and buffer 1014 to combine one clock from the I channel and one clock from the Q channel to form twenty-five percent clock IQ (25%) signals.

Instead of using a passive MUX, which can be lossy, to select between high-band and low-band modes, outputs of the buffers 1010 and 1012 can be directly connected together due to an arrangement of the switching components of the buffers 1010 and 1012. When the buffers 1010 and 1012 are off their buffer outputs 1040 act as open circuits. Gates of the PMOS devices of the buffers 1010 and 1012 can be connected to VDD through switch 1024 when the buffer is powered down (PD).

When the dividers 1004, 1006 or 1008 are off, the output 1030 is to ground which grounds the buffers 1010 or 1012 too. When the dividers 1004, 1006 or 1008 are on the buffers 1010 or 1012 can act as inverters. When the divider output 1030 is ground, the NMOS switch 1022 is off. Also, when divider output 1030 is ground, transmission switches 1026 and 1028 are off. Therefore, the gate of PMOS switch 1020 is disconnected from the divider output 1030. Also, switch 1024 connects VDD to the gate of PMOS switch 1020 to ensure that PMOS switch 1020 is disconnected from the output of the divider 1030. The switch 1024 can be sized to add substantially no capacitance to the circuit. In addition, switch 1020 is off, e.g., its gate connected with VDD, switch 1022 is off and the buffer output 1040 is an open circuit.

High-band and low-band buffers 1010 and 1012 can be implemented with switching circuits, two of which are illustrated for the buffer 1012. For example, four circuits per buffer 1010 and 1012 can include one for each of the clocks I+, I−, Q+ and Q−. The output of the I+ clock of buffer 1012 can be connected with, e.g., shorted to, the output of the I+ clock for buffer 1010. The output of the I− clock of buffer 1012 can be shorted to the output of the I− clock for buffer 1010. The output of the Q+ clock of buffer 1012 can be shorted to the output of the Q+ clock for buffer 1010. The output of the Q− clock of buffer 1012 can be shorted to the output of the Q− clock for buffer 1010. Since the buffer 1010 or 1012 for the band that is off acts as an open circuit no output interferes with the buffer 1010 or 1012 that is on. The buffer output 1040 can be sent to the AND gate/buffer 1014 to provide IQ (25%).

Figure 11:
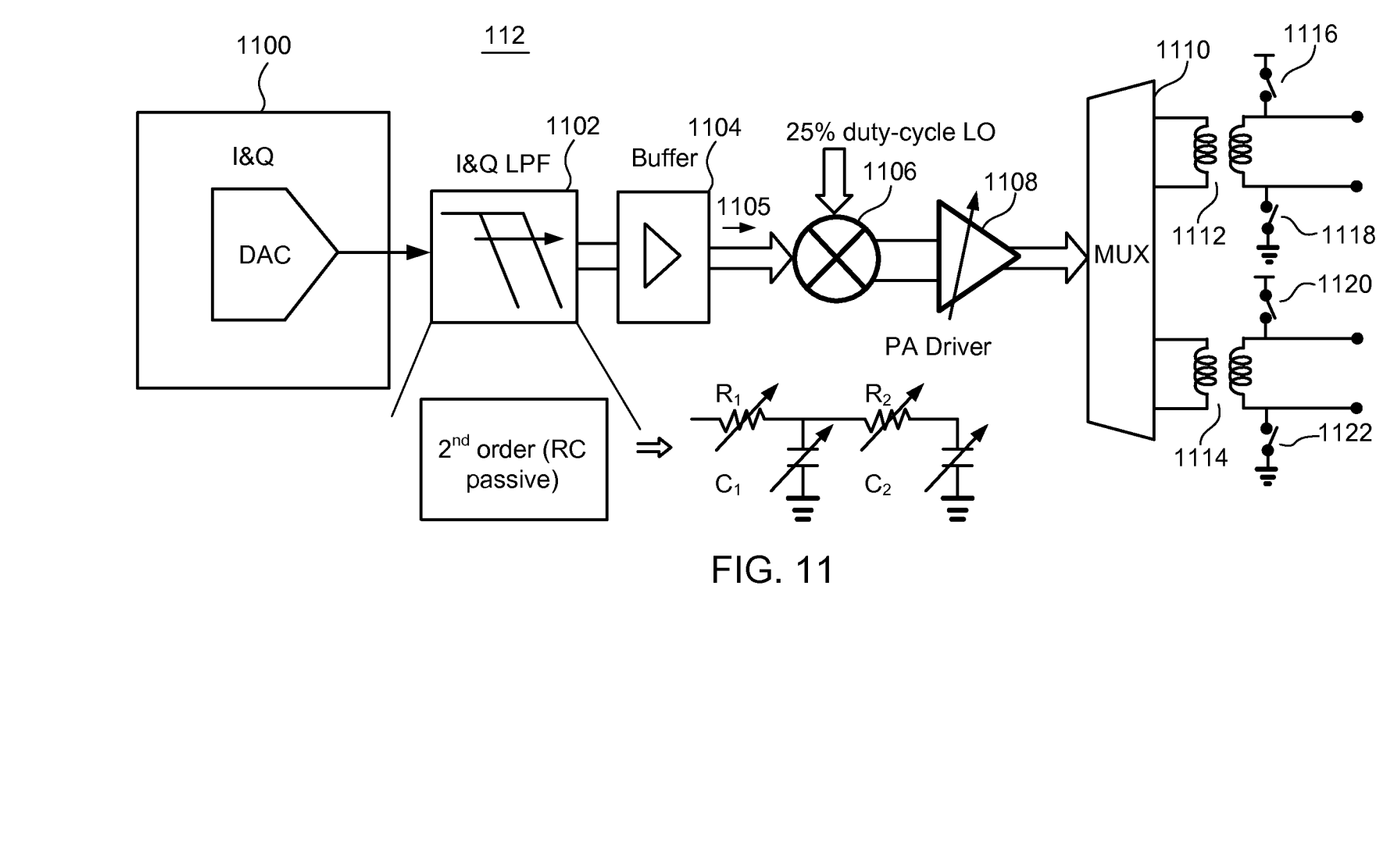
FIG. 11 is a circuit diagram for an exemplary low-pass filter design for the transmitter.

FIG. 11 is a circuit diagram for a low-pass filter design, such as for the transmitter 112. The transmitter 112 can include a DAC 1100, a second order passive LPF 1102, a buffer 1104, a mixer 1106 to mix LO with an analog signal 1105 sent by the buffer 1104, a PA driver 1108, a multiplexer or steering circuit 1110, transformers 1112 and 1114, and switches 1116, 1118, 1120 and 1122. The transmitter 112 can operate such as described in any of FIGS. 4 through 10.

The second order passive LPF 1102 can be used by compensating in the digital input of DAC 1100 for signal droop in the band. A digital input of the DAC 1100 is configured to apply resistor/capacitor compensation information for the second order passive LPF 1102. There can be about 0.6 dB droop for 2 Megahertz WCDMA or 100 Kilohertz EDGE. Resistor/capacitor (RC) calibration information can be used to determine in the amount of digital compensation required. For example, an inverse transfer function can be used with the RC calibration information to determine the amount of digital domain compensation to apply to the input of DAC 1100.

By changing from a third order active LPF to a second order passive LPF at least an op-Amp can be removed from the circuit. Therefore, an active baseband low-pass filter can be replaced with a passive one and a buffer 1104. The buffer 1104 can include low output impedance of about less than 5 ohms over the signal band. The buffer 1104 can include low output noise in the receiver (RX)-band, such as about 20 megahertz for 2G/8-PSK and 45 megahertz for 3G. The buffer 1104 can include high output impedance in the RX band to lower conversion gain for the noise components. The buffer 1104 can achieve these features, for example, via feedback.

The transmitter 112 may be used with various types of communication systems. The communication systems may include methods, devices, and logic implemented in different combinations of hardware, software or both hardware and software to utilize the transmitter 112. For example, communication functionality may be implemented using programmed hardware or firmware elements (e.g., application specific integrated circuits (ASICs), electrically erasable programmable read-only memories (EEPROMs), controllers, microprocessors, combinations of elements, etc.), or other related components.

The functionality may be achieved using a computing apparatus that has access to a code memory which stores computer-readable program code for operation of the computing apparatus, in which case the computer-readable program code could be stored on a medium which is fixed, tangible and directly readable, (e.g., removable diskette, compact disc read only memory (CD-ROM), random access memory (RAM), dynamic random access memory (DRAM), read only memory (ROM,) fixed disk, USB drive, or other machine-readable medium such as magnetic disk or optical disk), or the computer-readable program code could be stored remotely but transmittable via a modem or other interface device (e.g., a communications adapter) connected to a network (including, without limitation, the Internet) over a transmission medium, which may be either a non-wireless medium (e.g., optical or analog communications lines) or a wireless medium (e.g., microwave, infrared or other transmission schemes) or a combination thereof.

While various embodiments of the disclosure have been described, it will be apparent that many more embodiments and implementations are possible within the scope of the disclosure. Accordingly, the disclosure is not to be restricted except in light of the attached claims and their equivalents.

What is claimed is:

1. A transmitter, comprising:
   a power amplifier driver; and
   a first transformer configured for a high-band mode and a second transformer configured for a low-band mode connected with the power amplifier driver, where the power amplifier driver drives both the first transformer and the second transformer.

2. The transmitter of claim 1 further comprising a mixer connected with the power amplifier driver, the mixer configured to provide both high-band and low-band mixed signals to the power amplifier driver.

3. The transmitter of claim 1 where the power amplifier driver is configured to provide both gain control and high-band and low-band multiplexing.

4. The transmitter of claim 3 where the power amplifier driver further comprises a steering circuit configured to control the high-band or the low-band output.

5. The transmitter of claim 4 where the steering circuit is configured to turn on with a bias voltage of about 1.2 volts and turn off with a bias voltage of about 400 millivolts.

6. The transmitter of claim 4 where the steering circuit is configured to apply gain to a radio frequency signal.

7. The transmitter of claim 1 wherein the first transformer and the second transformer are powered by about a 1.5 volts or less supply voltage.

8. The transmitter of claim 1 further comprising a second order passive low pass filter connected with the power amplifier driver.

9. The transmitter of claim 8 further comprising a digital to analog converter connected with the second order passive low pass filter, where a digital input of the analog to digital converter is configured to apply resistor/capacitor compensation information for the second order passive low pass filter.

10. A transmitter, comprising:
    a low pass filter configured to filter an analog communication signal;
    a mixer connected with the low pass filter, the mixer configured to mix the analog communication signal with a local oscillator signal to produce a mixed signal; and
    a power amplifier driver connected with the mixer, the power amplifier driver including a gain unit and a steering circuit, the power amplifier driver configured to provide gain to the mixed signal and steer the mixed signal to a high-band transformer or a low band transformer.

11. The transmitter of claim 10 where the steering circuit comprises a high-band steering circuit and a low-band steering circuit to control a high-band and low-band output.

12. The transmitter of claim 10 where the steering circuit is configured to provide gain to the mixed signal.

13. The transmitter of claim 10 where the first transformer and the second transformer are powered by about 1.5 volts.

14. The transmitter of claim 10 where the low pass filter comprises a second order passive low pass filter.

15. The transmitter of claim 14 further comprising a buffer connected with the second order passive low pass filter where the buffer provides about 5 ohms or less output impedance to the analog communication signal.

16. The transmitter of claim 10 further comprising a digital to analog converter connected with the low pass filter where resistor/capacitor compensation information is applied to a digital input of the digital to analog converter.

17. A local oscillator generator for a transmitter, comprising:
    a first buffer to supply a transmission rate for a high-band mode;
    a second buffer to supply a transmission rate for a low-band mode; and
    an output of the first buffer directly connected to an output of the second buffer, wherein the first buffer and the second buffer operate as an open circuit when off.

18. The local oscillator generator of claim 17 further comprising an AND gate connected with the first buffer and the second buffer to provide a twenty-five percent clock signal.

19. The local oscillator generator of claim 17 where the second buffer include a circuit for the I+, Q+ and Q− channels.

20. The local oscillator generator of claim 17 where the circuit comprises a transmission switch to isolate an input to the second buffer from an output of the second buffer.

* * * * *

UNITED STATES PATENT AND TRADEMARK OFFICE
CERTIFICATE OF CORRECTION

| | | |
|---|---|---|
| PATENT NO. | : 8,538,347 B1 | Page 1 of 1 |
| APPLICATION NO. | : 13/448971 | |
| DATED | : September 17, 2013 | |
| INVENTOR(S) | : Ahmad Mirzaei et al. | |

It is certified that error appears in the above-identified patent and that said Letters Patent is hereby corrected as shown below:

<u>In the Claims</u>

In column 9, claim 19, lines 5-6, after "include a circuit for the" replace "I+, Q+ and Q-channels." with --I+, I-, Q+ and Q- channels.--.

Signed and Sealed this
Nineteenth Day of November, 2013

Teresa Stanek Rea
*Deputy Director of the United States Patent and Trademark Office*